United States Patent [19]
Shieh

[11] Patent Number: 5,656,403
[45] Date of Patent: Aug. 12, 1997

[54] METHOD AND TEMPLATE FOR FOCUS CONTROL IN LITHOGRAPHY PROCESS

[75] Inventor: Wen-Bin Shieh, Nantou Hsien, Taiwan

[73] Assignee: United Microelectronics Corporation, Taiwan

[21] Appl. No.: 593,803

[22] Filed: Jan. 30, 1996

[51] Int. Cl.$^6$ ........................................ G03F 7/00
[52] U.S. Cl. ................... 430/30; 430/5; 430/22; 355/123; 355/61; 355/77
[58] Field of Search ................ 430/30, 22, 396, 430/5; 355/61, 62, 77; 356/123; 437/8

[56] References Cited

U.S. PATENT DOCUMENTS

| | | | |
|---|---|---|---|
| 4,908,656 | 3/1990 | Suwa et al. | 355/77 |
| 5,044,750 | 9/1991 | Shamble | 430/30 |

FOREIGN PATENT DOCUMENTS

| | | | |
|---|---|---|---|
| 0466335 | 1/1992 | European Pat. Off. | 430/30 |
| 59-094418 | 5/1984 | Japan | 430/22 |
| 62-115830 | 5/1987 | Japan | 430/30 |
| 2-003043 | 1/1990 | Japan | 430/30 |
| 8-015854 | 1/1996 | Japan . | |

Primary Examiner—John A. McPherson
Attorney, Agent, or Firm—Cushman Darby & Cushman IP Group of Pillsbury Madison & Sutro, LLP

[57] ABSTRACT

Disclosed is a template and a method for using the template for focus control of pattern definition image in lithographic process, particularly for IC production. The template has at least a serrated vernier and at least a rhombus printed thereon. In use, the template is mounted on a mask used for pattern definition during a lithographic process. Upon development of a wafer image of the mask, in the normal course of lithography, there is also visible on the wafer an image of the template. This image, particularly the rhombus pattern, can be easily visually inspected by quality control personnel. The rhombus pattern shows a defocus condition because its normally straight and parallel sides and corners show a roundness even with the slightest defocus. Wafers that have not been properly imaged during lithography can be discarded without wasting further process steps in IC production to enhance yield.

14 Claims, 2 Drawing Sheets

METHOD AND TEMPLATE FOR FOCUS CONTROL IN LITHOGRAPHY PROCESS

BACKGROUND OF THE INVENTION

1. Field of the Invention

The present invention relates in general to a lithographic process for defining a pattern during fabrication of integrated circuits (ICs). More particularly, the invention provides a template and a method employing the template that allows an operator to check whether a mask pattern projected onto a wafer for IC production is in focus or not.

2. Description of Related Art

As the integration density of ICs increase, semiconductor fabrication takes place at the sub-micron very large scale integration (VLSI) level. Lithographic processes for pattern definition on a semiconductor wafer blank become more and more challenging. With the feature size of ICs reduced to sub-micron size ($<10^{-6}$ m), light used to expose an IC pattern on a blank wafer must have correspondingly shorter wavelengths, such as the g line of wavelength 465 nm, i line of wavelength 365 nm, or deep ultraviolet (DUV) of wavelength 248 nm. However it is difficult to use such wavelengths of light because of a focus problem. The depth of field of a mask image IC pattern focused onto a wafer from projection of a mask is significantly reduced. For example, consider the use of the KrF DUV as the exposure light in the fabrication of ICs of feature size 0.25 µm. The depth of field that can be obtained is less than 0.8 µm. Since the process latitude is dependent mainly on two factors: the critical dimension variation and the depth of field, more critical control of the focusing of the mask pattern on the wafer is required. A reduction in the critical dimension will sharply reduce the depth of field correspondingly. Therefore, focus control of a stepper for performing the lithographic process, becomes extremely critical.

The result of the lithographic process significantly affects the yield of IC fabrication. If the mask pattern definition image was not in proper focus the entire wafer must be discarded and the fabrication process started all over again on a new wafer.

FIG. 1 (Prior Art) is a schematic diagram of a conventional stepper performing a lithographic process for IC production. Light from an exposure light source 100 passes through an aperture 110 and a collimating lens 120 to a mask 130. Mask 130 has an IC pattern thereon which must be focused on a wafer 150. Light passing through the mask 130 is focused by a lens 140 to form an image of the mask pattern on the wafer 150.

Presently there is no setup standard for the stepper to check the precision of the focusing of the pattern definition image on the wafer. Also, it would be quite a laborious and time-consuming procedure to quantitatively obtain a measure of defocus of an out-of-focus image. Accordingly, defocus inspection is generally not carried out during IC production. Only when defocus significantly exceeds process latitude can quality control personnel recognize the defective condition. This lack of appropriate measures for timely inspecting whether a mask pattern image is in focus or not adversely affects quality control of the IC chip production. Poorly focused mask patterns don't become evident until final testing of the IC. If an IC is bad due to poor focus, many process steps are wasted.

SUMMARY OF THE INVENTION

It is therefore a primary objective of the present invention to provide a method and template for focus control of a mask pattern during a lithographic process for IC production which allows quality control personnel to visually inspect by using a microscope whether a pattern imaged on an IC wafer is out of focus.

It is another objective of the present invention to provide a template and a method for using that template for focus control of a mask pattern during a lithographic process, which allows IC wafers having an out-of-focus pattern to be discarded right after development of that pattern, thereby saving the costs associated with continued process steps that will ultimately be wasted because the IC will fail final inspection.

In accordance with the foregoing and other objectives of the present invention, there is provided a novel template and a method for using that template for focus control of a mask pattern imaged during a lithographic process. The method comprises the following steps:

mounting a template on a mask used for the pattern definition, the template having at least a serrated vernier pattern and at least a rhombus pattern printed thereon;

performing a lithographic process that images a pattern of the mask and the patterns of the template on a wafer; and visually inspecting the image pattern of the rhombus on the wafer to check whether roundness of the rhombus is within predefined process latitude.

The template has at least one rhombus pattern and at least one serrated vernier printed alongside the rhombus. A presently preferred embodiment of the template includes six (6) vernier and five (5) rhombus patterns. During visual inspection, an operator looks at the roundness of an imaged rhombus pattern to get an indication of a degree of defocus of the pattern on the wafer.

BRIEF DESCRIPTION OF DRAWINGS

The present invention will be more fully explained in the subsequent detailed description of the preferred embodiments thereof with references made to the accompanying drawings, wherein.

DETAILED DESCRIPTION OF PREFERRED EMBODIMENT

Figure 2:
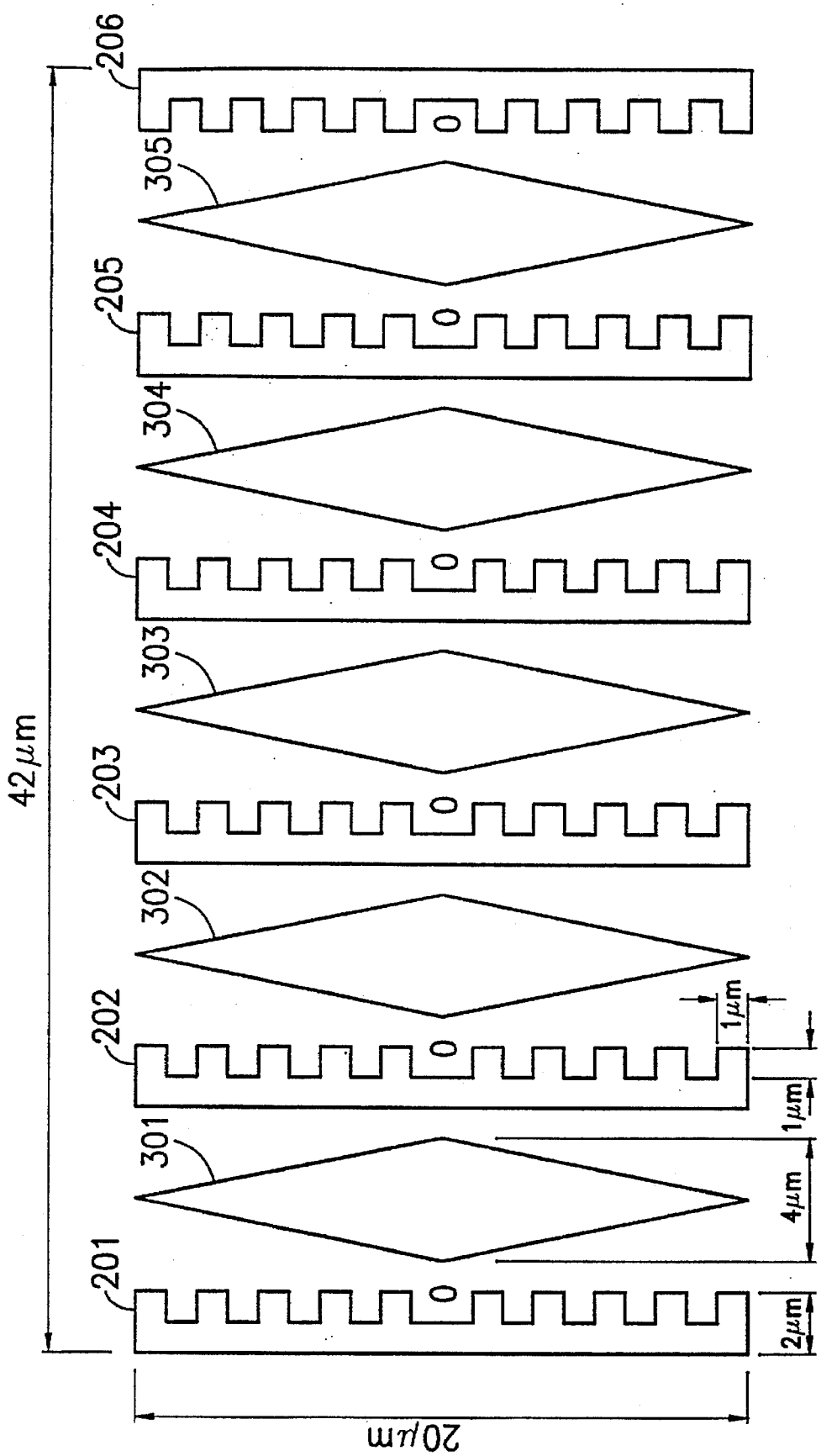
FIG. 2 is a top view of template according to the present invention for focus control of a pattern imaged during a lithographic process.

FIG. 2 is a top view of a template printed with a focusing aid pattern in accordance with the present invention. The pattern, in the presently preferred embodiment, includes six serrated verniers 201, 202, 203, 204, 205, and 206 and five rhombuses (equilateral parallelograms) 301, 302, 303, 304, and 305. The serrated verniers are used as scales alongside the rhombuses. Each of the serrated verniers 201, 202, 203, 204, 205, and 206 has a length of 20 µm and a width of 2 µm. Each tooth of a serrated vernier has a length of 1 µm and a width of 1 µm. Further, each of the rhombuses 301, 302, 303, 304, and 305 has a vertical diagonal line of length 20 µm and a horizontal diagonal line of length 4 µm. The overall length of the pattern formed on the template is 42 µm. The aforementioned numbers and sizes of the serrated verniers and rhombuses only represent the presently preferred embodiment of the present invention which is not limited to the particular numbers and sizes set forth in the example.

The numbers of serrated verniers and rhombuses and the sizes thereof can be varied based on different product specifications.

A rhombus pattern was selected for use because its shape is highly sensitive to defocus of its image. When a rhombus pattern is imaged and is even slightly out of focus, the normally straight and parallel sides and the corners show a curvature that becomes readily apparent. This characteristic allows an operator to visually inspect to determine whether a pattern imaged during the lithographic process was in focus or not after the photoresist is developed. If defocused, the rhombus pattern on the wafer would exhibit a rounding effect, which means that the four corners would appear rounded. The degree of roundness increases as the degree of defocus increases. The serrated verniers placed alongside the rhombuses allow the quality control personnel to visually inspect the degree of roundness of the rhombus patterns on the wafer by using microscopes.

Figure 1:
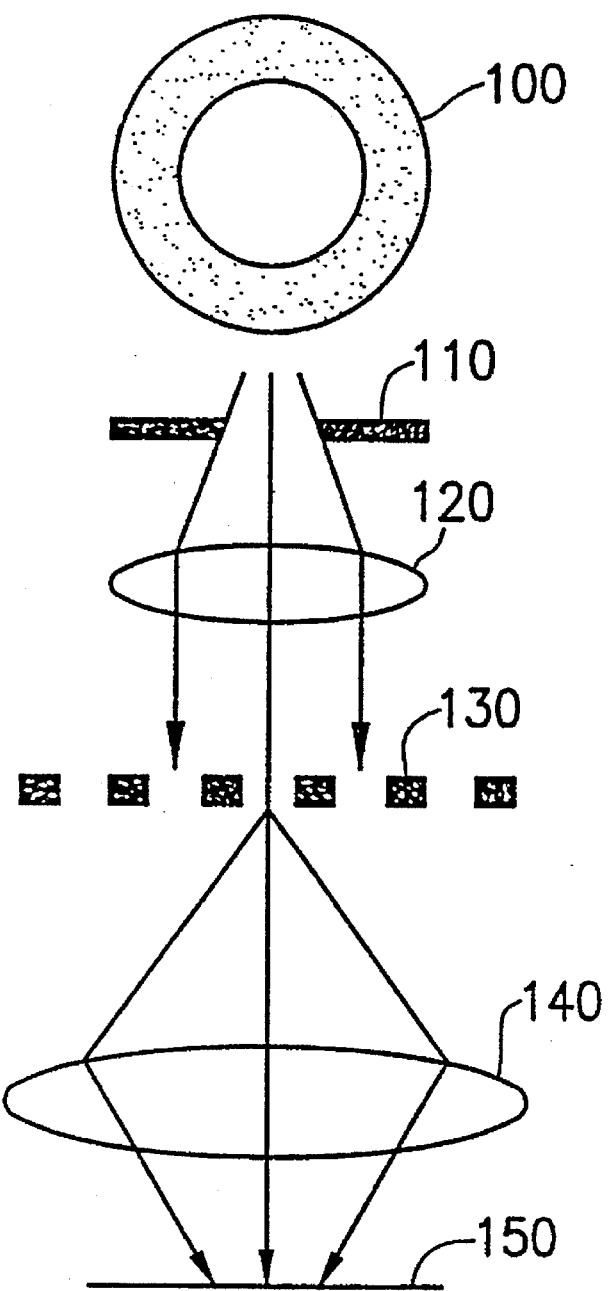
FIG. 1 (Prior Art) is a schematic diagram of a conventional stepper performing a lithographic process.

According to the invention, the template shown in FIG. 2 would be used in a lithographic process of the type shown in FIG. 1 (Prior Art). The template would be mounted at appropriate positions on the mask 130, normally on corners and/or scribes. When the light from the exposure light source 100 projects the mask-defined pattern on the wafer 150, the image of the template would also projected on the wafer 150. After development, images of the serrated verniers and the rhombuses are also formed on the wafer 150. As previously described, the rhombus pattern is highly sensitive to defocus. Therefore, if the projection was made out-of-focus, the rhombus patterns on the wafer 150 would be rounded. The operator can thus use a microscope to visually inspect the degree of roundness of the rhombus patterns measured using the serrated verniers alongside the rhombus patterns. If the degree of roundness is within a predetermined process latitude, the wafer is considered to be good.

In the foregoing disclosed preferred embodiment, the purpose of providing six serrated verniers and five rhombuses is to prevent a proximity effect that would otherwise affect the accuracy of the focus control. The proximity effect occurs with respect to a rhombus on the template that is placed proximate to the circuit pattern on the mask. Rhombuses are provided on either side of the template, i.e., 301 and 305 are proximate to the circuit pattern when the template is mounted on the mask and therefore the projected images of the two would be subject to the proximate effect. Since the proximate effect is not a result of defocus, any blurredness of the image of the two rhombuses 301, 305 on the wafer should therefore be ignored during inspection. The quality control personnel should therefore inspect only the middle rhombus, i.e., 303 for accurate quality control of the pattern definition in the lithographic process.

The present invention has been described hitherto with respect to exemplary preferred embodiments. However, the scope of the invention is not limited to the specific embodiments disclosed. On the contrary, the claims are intended to cover various modifications and similar arrangements that would occur to one of ordinary skill in the art to which this invention pertains having the benefit of the teachings in this patent. The scope of the claims should be accorded the broadest interpretation so as to encompass all such modifications and similar arrangements.

What is claimed is:

1. A method for focus control of a mask pattern during a lithographic process, comprising the steps of:
   mounting a template on a mask used for the pattern definition, the template having a serrated vernier pattern and a rhombus pattern printed thereon;
   performing a lithographic process to form an image pattern of the mask and the template on a wafer; and
   visually inspecting the image pattern of the rhombus on the wafer to check whether roundness of the rhombus is within a predefined process latitude.

2. A method as claimed in claim 1, wherein the template pattern has a plurality of serrated verniers and a plurality of rhombuses arranged alternately thereon.

3. A method as claimed in claim 1, wherein the template pattern has six (6) serrated verniers and five (5) rhombuses arranged alternately thereon.

4. A method as claimed in claim 3, wherein the pattern on the template has a length of about 42 µm and a width of about 20 µm.

5. A method as claimed in claim 3, wherein each rhombus on the template has a diagonal length of about 20 µm and a diagonal width of about 4 µm.

6. A method as claimed in claim 3, wherein each serrated vernier on the template has a length of about 20 µm and a width of about 2 µm.

7. A method as claimed in claim 6, wherein each tooth of a serrated vernier has a length of about 1 µm and a width of about 1 µm.

8. A template for focus control of a mask pattern during a lithographic process, comprising:
   a template base;
   a rhombus pattern printed on the template base; and
   a serrated vernier pattern printed alongside the rhombus on the template base, the template being shaped and arranged such that it can be mounted on a mask used for pattern definition on a wafer in a lithographic process so as to develop an image pattern of the rhombus and the serrated vernier on the wafer, a visual inspection of the roundness of the rhombus imaged on the wafer determining a degree of defocus of a mask pattern on the wafer.

9. A template according to claim 8, wherein there are a plurality of serrated vernier patterns and a plurality of rhombus patterns arranged alternately on the template base.

10. A template according to claim 8, wherein the template base has printed thereon six (6) serrated vernier patterns and five (5) rhombus patterns arranged alternately.

11. A template according to claim 10, wherein the pattern printed on the template base has a length of about 42 µm and a width of about 20 µm.

12. A template according to claim 10, wherein each rhombus pattern has a diagonal length of about 20 µm and a diagonal width of about 4 µm.

13. A template according to claim 10, wherein each serrated vernier pattern has a length of about 20 µm and a width of about 2 µm.

14. A template according to claim 13, wherein each tooth of a serrated vernier pattern has a length of about 1 µm and a width of about 1 µm.

* * * * *